United States Patent [19]

Thies

[11] 4,173,003
[45] Oct. 30, 1979

[54] DELTIC (TIME COMPRESSOR) WITH ADJUSTABLE MULTIPLICATION RATIO

[75] Inventor: Fred W. Thies, Greensboro, N.C.

[73] Assignee: The United States of America as represented by the Secretary of the Navy, Washington, D.C.

[21] Appl. No.: 102,246

[22] Filed: Dec. 28, 1970

[51] Int. Cl.² .......................... H03H 7/38; H04B 1/00
[52] U.S. Cl. .................................. 333/165; 333/144; 328/37; 328/55; 179/15.5 T
[58] Field of Search ..................... 340/172.5; 333/165, 333/144; 328/37, 55

[56] References Cited

U.S. PATENT DOCUMENTS

| | | | |
|---|---|---|---|
| 3,064,241 | 11/1962 | Schneider | 340/172.5 |
| 3,278,907 | 10/1966 | Barry et al. | 340/172.5 |
| 3,462,411 | 8/1969 | Deskevich et al. | 340/172.5 |

*Primary Examiner*—Nelson Moskowitz
*Attorney, Agent, or Firm*—Richard S. Sciascia; Robert W. Adams

[57] ABSTRACT

A delay line time compressor which can be operated at different multiplication factors by virtue of changes in the length of the recirculation loop for selected parts of the recirculation routine. A preferred embodiment utilizes an organization of parallel recirculation loops and is well adapted to semiconductor shift register implementation. Another embodiment utilizes a single high frequency delay element such as glass, in combination with a shift register.

2 Claims, 6 Drawing Figures

DELTIC (TIME COMPRESSOR) WITH ADJUSTABLE MULTIPLICATION RATIO

BACKGROUND OF THE INVENTION

This invention relates to delay line time compressors, generally referred to as deltics, and more particularly to an improved deltic which can be selectively operated at different speed-up ratios and hence may be termed a universal deltic.

There exists a need for such a universal deltic for use in connection with a spectrum analyzer which is designed to operate on signals multiplied by a factor M of up to 96,240 from the baseband or real time source signals. In one such frequency analyzer system the baseband signals are recorded on tape and played back at a multiplication factor $M_1$ of 240 from the baseband. The universal deltic, inserted between the tape machine and the spectrum analyzer, would be required to provide a factor $M_2$ of 401 to render the desired maximum factor of 96,240, M being equal to the product of $M_1$ and $M_2$. When vernier operation is desired at a speed-up ratio of 240:1, $M_2$ would be increased to 1203, and $M_1$ would be left at 240, whereby M would be increased to $3 \times 96,240$, and the bandwidth of the signal at the deltic input would be reduced by a factor of three. If real-time operation were desired, the input signal would be fed directly to the deltic, reducing $M_1$ to unity, and increasing $M_2$ to 96,240. Since the analyzer concerned can process the same number of frequency resolution elements/sec. in the real-time mode as in the nonreal-time mode, it could be time-shared between 240 real-time channels. From the foregoing, it will be apparent that there exists a need for a universal deltic, the multiplication factor or ratio M of which can be selectively varied. Now, the general arrangement and use of deltic recirculation loops for the purpose of permitting the processing of data at rates faster than real time is well known. Such arrangements are useful in connection with the input of data to a spectrum analyzer, for example, as discussed in U.S. Pat. No. 2,958,039 of V. C. Anderson.

Briefly, a deltic with a multiplication ratio of M is a device which takes amplitude samples (spaced incremental time units apart) of an input waveform and stores them closer together in a delay line memory D seconds in length. Since a given baseband input S seconds in length is reduced by a factor of M to D seconds, a spectrum analyzer can "look" at the deltic output M times before a given time-record is completely replaced in the delay line by new input data. Hence, time compression allows one spectrum analyzer to process many discrete frequencies in the time that would otherwise have been consumed to process one.

The delay line portion of a conventional deltic may comprise either a device such as an N-bit glass delay line operating on ultrasonic propagation, or a device such as an N-bit shift register. A simple conventional deltic using an N-bit shift register comprises a sample gate connected to introduce sample pulses or bits into a recirculation loop consisting of the shift register and an inhibit gate. The shift register is operated at a clock determined bit rate of $F_c$ Hz and has an overall delay of D seconds. The sample and inhibit gates are used to allow a sample pulse, occurring at a rate of $F_s$ Hz, to replace the oldest bit in the shift register with a new bit of information from an analog to digital converter every time the information in the loop makes n recirculations. The simplest such deltic results when $n=1$ and new information is inserted in the loop every $N+1$ clock intervals. Since $$M = F_c/F_s, \qquad \text{(Eq. 1)}$$

the multiplication for $n=1$ is given by $$M = N+1. \qquad \text{(Eq. 2)}$$

For $n \geq 1$, the multiplication is given by $$M = nN+1. \qquad \text{(Eq. 3)}$$

It is, of course, necessary to make $n>1$ when the input sampling period is greater than the delay line length, D.

In a more general, well known form of deltic, provision is made for inserting k bits of information into the loop every n recirculations of the memory record. To this end, a buffer store is used to collect $k-1$ of the k bits to be inserted in the loop. The kth bit is available on line at the analog to digital converter output. A parallel-to-serial converter puts parallel bits at the buffer store output into the delay line sequentially. The multiplication, M, for the general deltic is given by $$M = nN+k/k \qquad \text{(Eq. 4)}$$

or $$M = nN/k+1. \qquad \text{(Eq. 5)}$$

From Eq. 5, it is apparent that M can be varied by changing either n, N, or k. It is not desirable to vary k, since the length of the two registers and the repetition rate of one control pulse would have to be altered. It would be preferable to vary n. However, if n is increased by a factor of three, for example, as would be necessary for the earlier mentioned vernier operation, the multiplication M does not increase by precisely a factor of three.

SUMMARY OF THE INVENTION

With the foregoing in mind, it is a principal object of this invention to provide an improved deltic configuration in which the multiplication M varies directly with n and is given by $$M = n\left(\frac{N}{k} \neq 1\right). \qquad \text{(Eq. 6)}$$

Another object of this invention is the provision of an improved, universal deltic device of the foregoing character which, in one embodiment may utilize an N-bit loop comprising a glass or quartz delay line, and in another embodiment may utilize a plurality of parallel N/k bit loops comprising shift registers operated as delay elements. The latter embodiment, using metal oxide semi-conductor shift register delay elements operating at clock rates of 10 M Hz or less would be a particularly desirable arrangement.

As another object this invention aims to achieve the foregoing through the provision of novel deltic configurations comprising means for changing the effective length of the recirculation loop between sample intervals.

BRIEF DESCRIPTION OF THE DRAWINGS

Other objects and advantages of the invention will become apparent from the following description of the presently preferred embodiments when read in conjunction with the accompanying sheets of drawings, in which.

DESCRIPTION OF THE PREFERRED EMBODIMENTS

Figure 1:
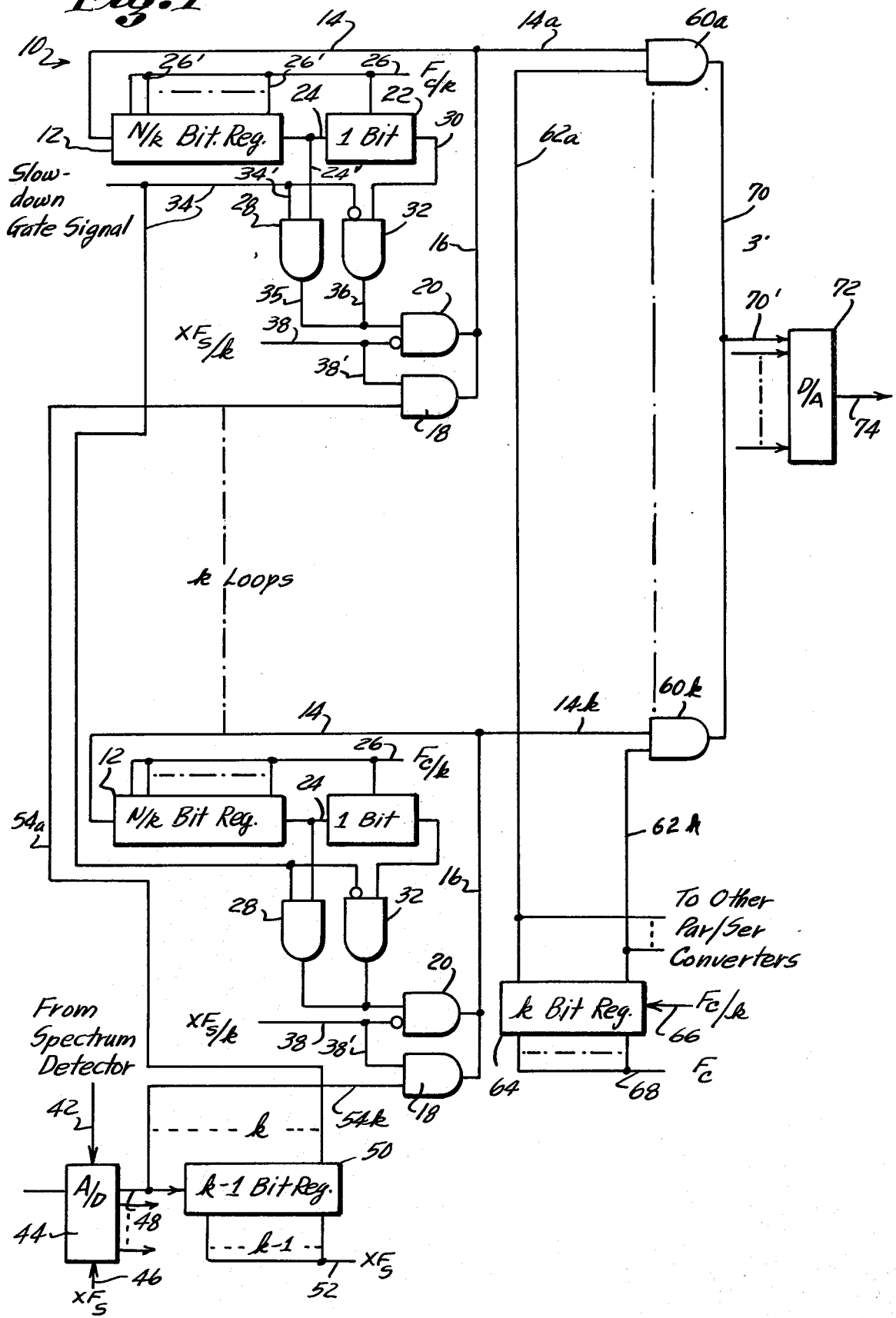
FIG. 1 is a diagrammatic illustration in block form of a deltic device embodying the invention.

In the form of the invention illustrated in FIG. 1, a universal deltic 10 is provided comprising a parallel organization of a plurality of recirculation loops, k in number. Each of the recirculation loops comprises an N/k bit shift register 12 which is connected to receive data bits via a line 14 and a line 16 leading from the outputs of a sample AND gate 18 and an inhibit AND gate 20. The gates 18 and 20 serve to control the introduction of sample bits and the recirculation thereof in a manner which will be later described in more detail.

Each of the parallel recirculation loops further comprises a one bit register 22 connected as shown by line 24 to serve as an additional shift register stage and increase the length of the recirculation loop at times and for reasons which will be made apparent as the description proceeds.

The N/k shift register 12 and the one bit register 22 are operated at a shift rate of Fc/k, that is a predetermined clock frequency from a suitable clock source, divided by the number of parallel loops in the organization 10. This frequency Fc/k is applied as shown by lines 26, 26'.

The output of the shift register 12 on line 24 is applied via line 24' as one input to an AND gate 28, whereas the output of the one bit register 14 is applied via line 30 as one input to an AND gate 32. A speed or slowdown control gate signal is applied, at times referred to hereinafter, via lines 34, 34' as an inhibit command to AND gate 32 and as an enabling command to AND gate 28. The gates 28 and 32 serve as a single pole double throw switch to either include the one bit register 22 in the loop or to bypass it, thereby lengthening or shortening the loop by one bit. Thus, the outputs of the AND gates 28, 32 on lines 35, 36 are connected as one input to the inhibit AND gate 20.

The other input to the AND gate 20 is an inhibit signal applied via lines 38, 38a at a frequency $XF_s/k$, where $XF_s$ is a multiple of the sampling rate $F_s$ at which samples are taken from a frequency spectrum which is to be analyzed, for example.

A signal from a spectrum detector is applied as shown by flow line 42 to an analog to digital converter 44, which samples the input frequency signal at a sampling rate $XF_s$ as indicated by line 46. The digitized output of the converter 44 is applied via line 48 to a $k-1$ bit shift register 50 operated at the rate $XF_s$ as indicated by line 52. The $k-1$th sample bit is applied via line 54a as the remaining input to the sample gate 18 associated with the first of the k parallel loops, while each sample bit is applied via line 54k to the gate 18 of the kth of the parallel loops. The gates 18 of the intermediate loops receive intermediate sample bits from the intermediate stages of the $k-1$ bit shift register 50.

The status of each of the recirculation loops at any time is taken via lines 14a–14k and applied as a first input to each of corresponding AND gates 60a–60k. The AND gates 60a–60k are enabled by signals conveyed via lines 62a–62k and derived from a k bit shift register 64 having an input of Fc/k represented by line 66, and a shift rate of the clock frequency Fc represented by line 68. The outputs of the AND gates 60a–60k are applied via lines 70, 70' to a digital to analog converter 72 to effect parallel to serial conversion and render a time compressed analog output on line 74 thereof.

Figure 2:
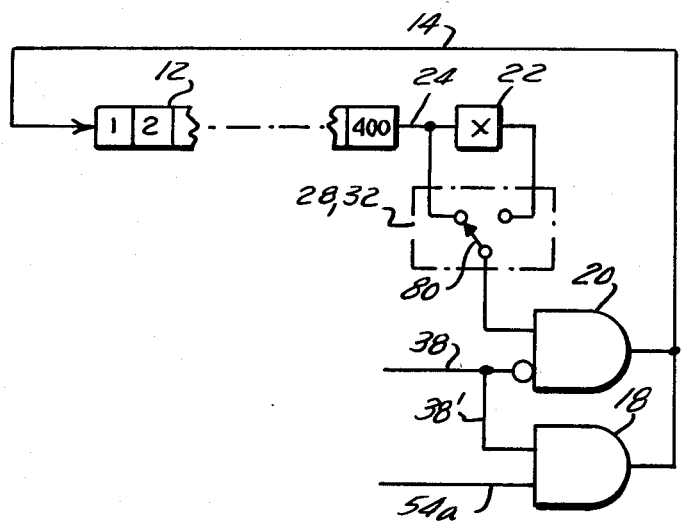
FIGS. 2–4 are simplified diagrammatic illustrations of the operating principles of the device of FIG. 1.
Figure 3:
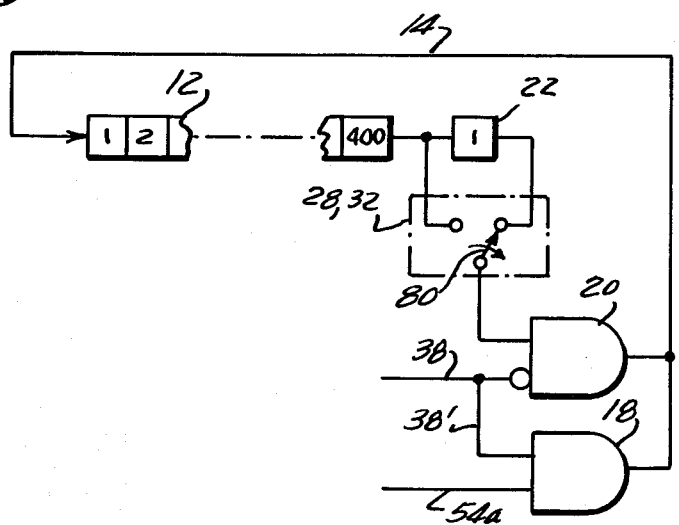
Figure 4:
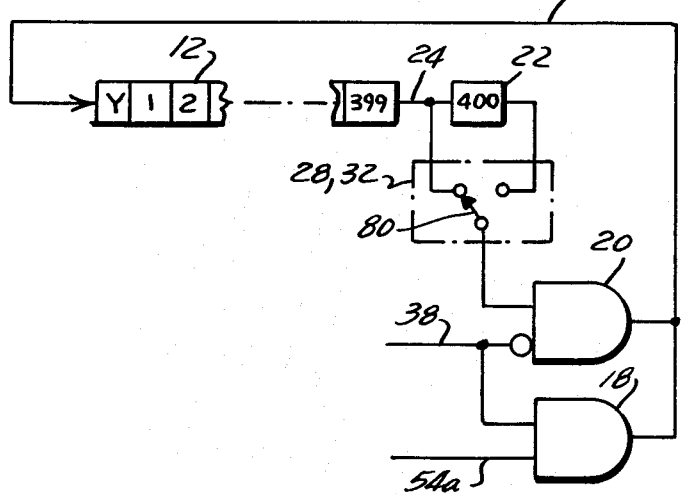

Now, with reference to FIGS. 2–4 it will be shown that a multiplication given by $$M = n\left(\frac{N}{k} \neq 1\right).$$

can be obtained by varying the length of each individual loop between sample intervals. A single one of the k loops of the preferred embodiment of FIG. 1 is shown in FIG. 2, with a single pole, double throw switch 80 utilized to illustrate the function of the AND gates 28, 32.

Consider the switch 80 to be left in its full line, short loop position for one recirculation out of every n recirculations of the information in the loop, and to be placed in the dotted line or long loop position for $n-1$ recirculations. The multiplication effected can, therefore, be expressed as:

$$M = \frac{N}{k} \neq (n-1)\left(\frac{N}{k} \neq 1\right) \neq 1, \text{ or}$$

$$M = n\left(\frac{N}{k} \neq 1\right).$$

For example, if N/k=400 and n=1, then:

$$M = 400 + (1-1)(400+1)+1,$$

or $$M = 400 + 0 + 1 = 401.$$

If n is increased to 3, then:

$$M = 400 + (3-1)(400+1)+1,$$

or $$M = 400 + 401 + 401 + 1 = 1203.$$

And if n=240, then $$M = 400 + 239(401) + 1 = 96,240.$$

To illustrate the case where n=3, consider the 401 bits stored in the deltic memory 12 shown in FIG. 2. The sample pulse has just gated bit 1 into the front end of the register (x is the bit of information that bit 1 replaced). With n=3, bit 400 should be replaced during the 1203rd clock interval following the previously mentioned sample pulse. After 400 clock intervals have passed, the 400 bits in the main register 12 will have returned to their original positions. However, bit x will have been replaced by bit 1 as shown in FIG. 3. The switch 80 is now put in the long loop position for the next 802 clock intervals, after which the information will be in the same position, as shown in FIG. 3. The switch 80 is then returned to the short loop position, so that the sample pulse occurring during the 1203rd clock interval can replace bit 400 with new information (bit Y), see FIG. 4. The process is then repeated.

Figure 5:
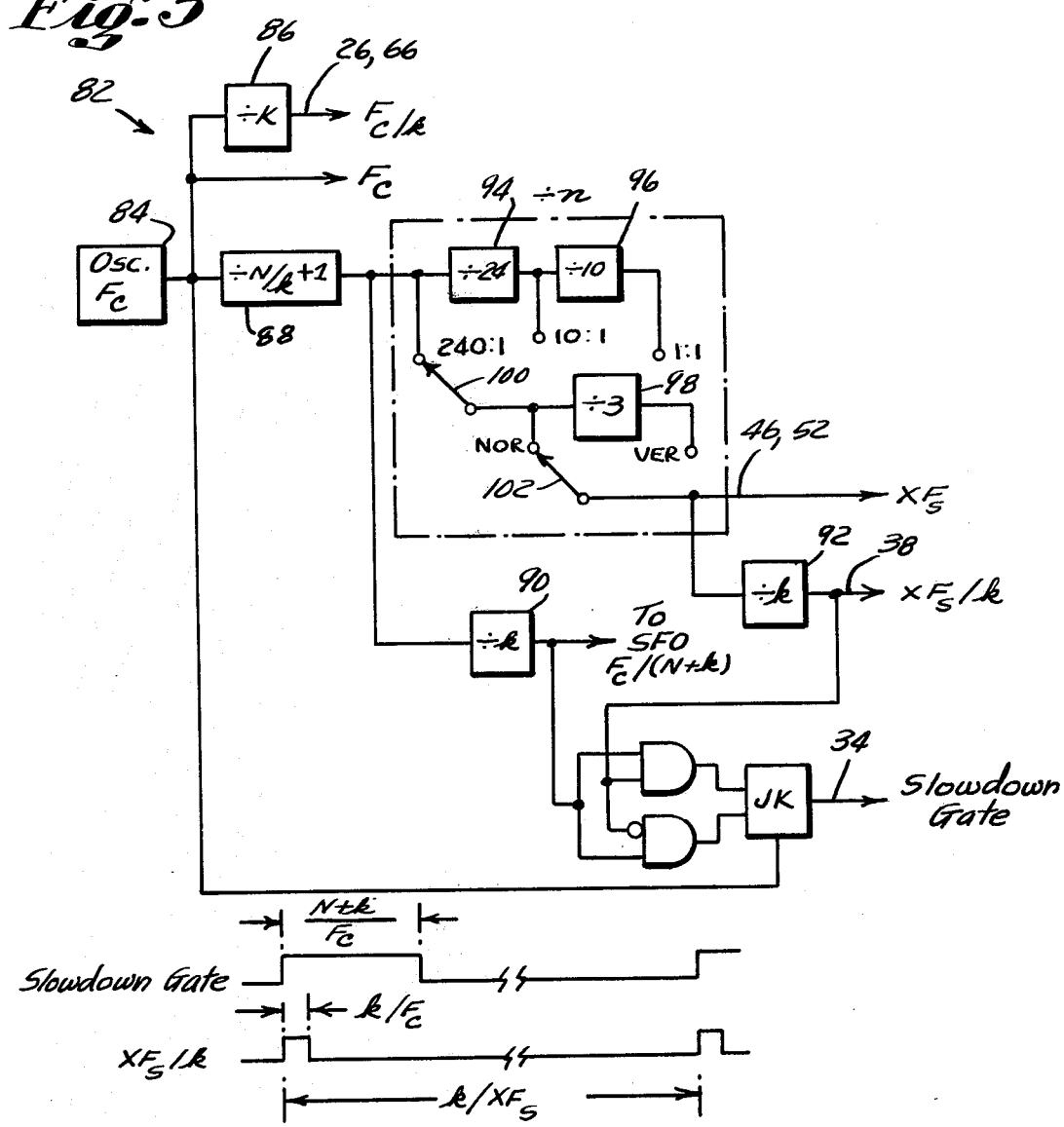
FIG. 5 is a diagrammatic illustration in block form of a source of control signals for the device of FIG. 1.

FIG. 5 shows a synchronous counter circuit 82 which serves as a source of the various control signals for operation of the embodiment of FIG. 1 with values of n of 240; 10; 3; or 1. The circuit 82 comprises an oscillator 84 which provides clock signals of frequency $F_c$. These are divided by frequency dividers 86, 88, 90, 92, 94, 96, and 98 to derive the desired outputs on lines 26, 34, 38, 46, 52, and 66. Of the dividers, 94, 96 and 98 cooperate with switch means 100 for selecting the desired value of n, and with switch means 102 for selecting normal or vernier operation.

Figure 6:
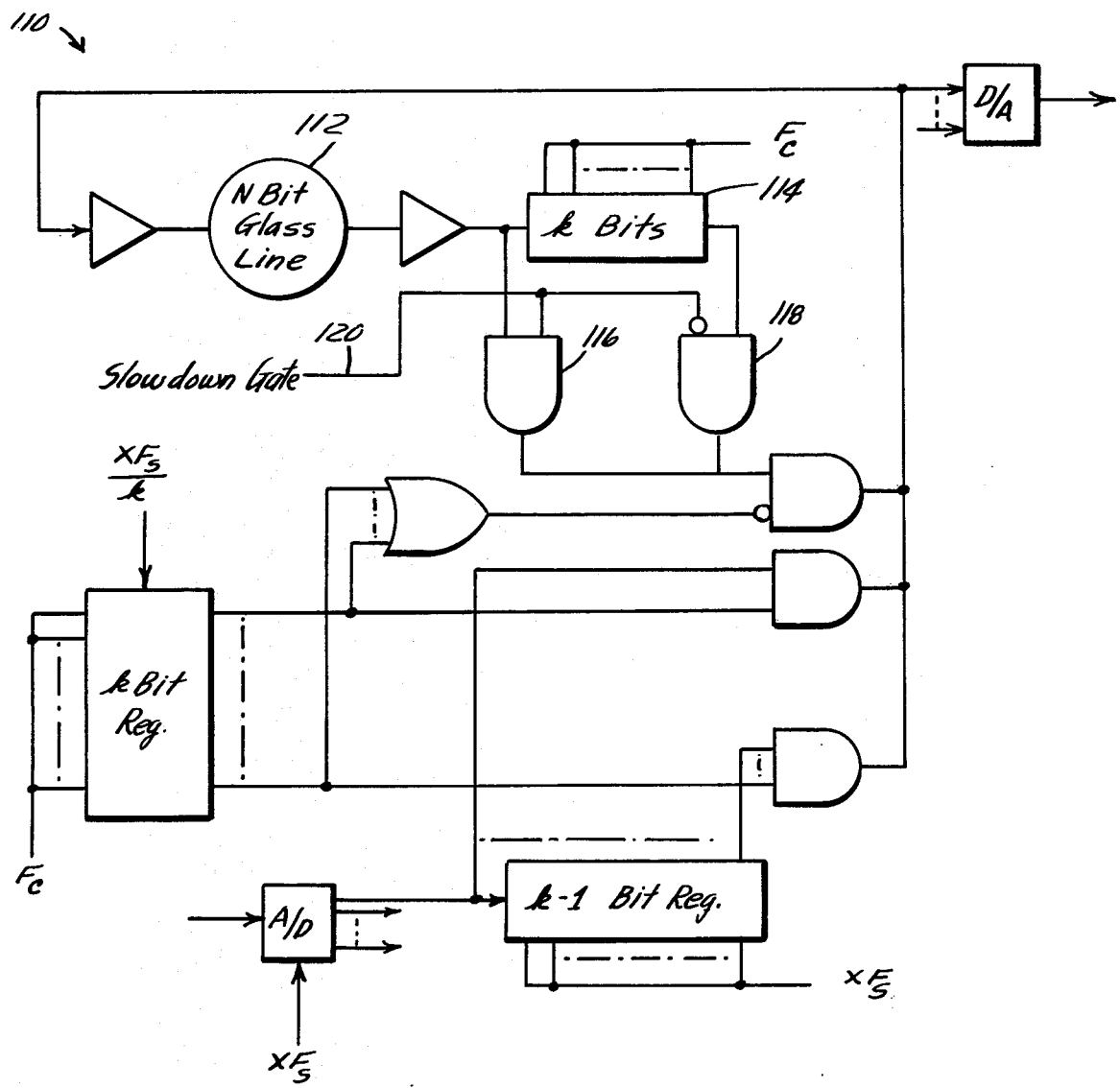
FIG. 6 is a diagrammatic illustration in block form of another deltic device embodying the invention.

Referring now to FIG. 6, there is illustrated a different embodiment 110 of universal deltic employing a single variable length loop comprising an N-bit high frequency delay line 112 and a k-bit shift register 114. AND gates 116 and 118, corresponding to the AND gates 28, 32, or the switch 80 of the previous embodiment, serve to lengthen or shorten the loop in response to presence or absence of a slowdown gate applied via line 120.

It has been shown that by varying the recirculating loop length, a universal deltic can be provided to operate at 240/n times real time, where n is any positive integer. Of course, by appropriate changes in the dividers used in the control pulse source of FIG. 6, other ratios can be achieved. By using a single or multiple loop configuration, the universal deltics can be implemented with ultrasonic delay lines or with semiconductor shift register memories. Since operation at many speed-up ratios is possible, the same deltic spectrum analyzer and stepped frequency oscillator can be used for normal or vernier operation in either the real-time or nonreal-time path in the application of the invention described earlier in this specification. Since the deltic input data rate is low in the real-time path, one spectrum analyzer can be used to process data from up to 240 channels.

Obviously many modifications and variations of the present invention are possible in the light of the above teachings. It is therefore to be understood that within the scope of the appended claims the invention may be practiced otherwise than as specifically described.

What is claimed is:

1. In a deltic device comprising in combination data recirculation loop means, means for feeding data signals into said loop means, and a source of control signals for controlling input, recirculation, and output of data signals;

first time delay means forming part of said recirculation loop means and having a first predetermined delay length;

second time delay means having a second predetermined delay length;

switching means connected to said first and second delay means and responsive to said control signals to connect said second delay means into and out of series relation with said first delay means in said recirculation loop means so as to provide long recirculation loop means for a first predetermined number of recirculations and shorter recirculation loop means for a second predetermined number of recirculations;

said recirculation loop means comprising a plurality of recirculation loops, k in number;

said first delay means comprising an N/k bit shift register for each of said loops, where N is the total bit capacity of said first delay means;

said second delay means comprising a single bit register for each of said loops; and said switching means comprising individual switching means for each of said loops and responsive to said control signals to connect the respective single bit registers into and out of series relation with the corresponding shift registers.

2. In a deltic combination according to claim 1:

said source of control signals comprising oscillator means;

a plurality of frequency divider means connected to said oscillator means and operative to provide a plurality of control signals of predetermined frequency and time relation; and switch means for selectively deriving said control signals from different ones of said frequency divider means.

* * * * *